(12) United States Patent
Abramovici et al.

(10) Patent No.: US 6,574,761 B1
(45) Date of Patent: Jun. 3, 2003

(54) ON-LINE TESTING OF THE PROGRAMMABLE INTERCONNECT NETWORK IN FIELD PROGRAMMABLE GATE ARRAYS

(75) Inventors: Miron Abramovici, Berkeley Heights, NJ (US); Charles E. Stroud, Lexington, KY (US)

(73) Assignee: Lattice Semiconductor Corp., Hillsboro, OR (US)

( * ) Notice: Subject to any disclaimer, the term of this patent is extended or adjusted under 35 U.S.C. 154(b) by 0 days.

(21) Appl. No.: 09/406,219

(22) Filed: Sep. 27, 1999

(51) Int. Cl.⁷ .............................................. H04B 17/00

(52) U.S. Cl. ..................... 714/725; 714/738; 714/734

(58) Field of Search ................................ 714/725, 733, 714/224, 734, 738

(56) References Cited

U.S. PATENT DOCUMENTS

| | | | |
|---|---|---|---|
| 4,757,503 A | | 7/1988 | Hayes et al. |
| 5,051,996 A | | 9/1991 | Bergeson et al. |
| 5,107,208 A | | 4/1992 | Lee |
| RE34,445 E | | 11/1993 | Hayes et al. |
| 5,260,946 A | | 11/1993 | Nunally |
| 5,278,841 A | | 1/1994 | Myers |
| 5,347,519 A | | 9/1994 | Cooke et al. |
| 5,425,036 A | | 6/1995 | Liu et al. |
| 5,430,734 A | | 7/1995 | Gilson |
| 5,488,612 A | | 1/1996 | Heybruck |
| 5,508,636 A | | 4/1996 | Mange et al. |
| 5,623,501 A | | 4/1997 | Cooke et al. |
| 5,959,912 A | * | 9/1999 | Powell et al. ............... 365/201 |
| 5,991,213 A | * | 11/1999 | Cline et al. ................. 365/201 |
| 5,991,907 A | * | 11/1999 | Stroud et al. ............... 714/725 |

OTHER PUBLICATIONS

G. Gibson et al., "Boundary–Scan Access of Built In Self Test for Field Programmabl Gate Arrays," Proc. IEEE Internationa ASIC Conf. pp. 57–61, Sep. 7–10, 1997.

A. Hassan et al., "Testing and Diagnosis of Interconnects Using Boundary Scan Architecture," Proc. IEEE International Test Conf. pp. 126–137, Sep. 12–14, 1988.

(List continued on next page.)

Primary Examiner—Phung M. Chung

(57) ABSTRACT

A method of self-testing the programmable routing network in a field programmable gate array (FPGA) during normal on-line operation includes configuring the FPGA into an initial self-testing area and a working area. The initial self-testing area is preferably configured to include an horizontal self-testing area primarily for testing horizontal wire segments and a vertical self-testing area primarily for testing vertical wire segments. Programmable logic blocks located within the self-testing areas are configured to function as a test pattern generator and an output response analyzer, and a portion of the programmable routing resources within the self-testing areas is configured as groups of wires under test. An exhaustive set of test patterns generated by the test pattern generator is applied to the groups of wires under test which are repeatedly reconfigured in order to completely test the programmable routing resources within the self-testing areas. The outputs of the groups of wires under test are compared by the output response analyzer and resultant fault status data for each group of wires under test is received by a controller in communication with a memory for storing the fault status data. After completely testing the programmable routing resources in one of the initial self-testing areas, the FPGA is reconfigured such that a portion of the working area becomes a subsequent self-testing area and at least a portion of one of the initial self-testing areas replaces that portion of the working area. In other words, the self-testing areas rove around the FPGA repeating the steps of testing and reconfiguring until the entire FPGA has undergone testing or continuously.

26 Claims, 5 Drawing Sheets

OTHER PUBLICATIONS

W.K. Huang et al., "An Approach to Testing Programmable/Configurable Field Programmable Gate Arrays," Proc. IEEE VLSI Test Symp pp. 450–455, Apr. 28–May 5, 1996.

T. Liu et al., "Diagnosis of Interconnects and FPICS Using a Structured Walking–1 Approach," Proc. IEEE VLSI Test Symp, pp. 256–261, Apr. 30–May 3, 1995.

F. Lombardi et al., "Diagnosing Programmable Interconnect Systems for FPGAS," Proc. ACM/SIGDA International Symp on FPGA, pp 100–106, 1996.

C. Stroud et al., "Evaluation of FPGA Resources for Built In Self Test of Programmable Logic Blocks," Proc ACM/SIGDA Inter. Symp. on FPGAS pp 107–113, 1996.

C. Stroud et al., "Built In Self Test for Programmable Logis Blocks in FPGA," Proc IEEE VLSI Test Symp, pp 387–392, Apr. 28–May 1, 1996.

C. Stroud et al., "Using ILA Testing for BIST in FPGAS," Proc IEEE International Test Conf., pp 68–75, Oct. 20–25, 1996.

C. Stroud et al., "BIST Based Diagnostics for FPGA Logic Blocks," Proc. IEEE International Test Conf., pp 539–547, Nov. 1–6, 1997.

N. Shnidman et al., "On–Line Fault Detection for BusBased Field Programmable Gate Arrays," IEEE Transactions on VLSI Systems, vol. 6, No. 4, Dec., 1998.

L. Shombert et al., "Using Redundancy for Concurrent Testing and Repairing of Systolic Arrays," Proc. 17th Fault-Tolerant Computing Symp., 1987.

* cited by examiner

ON-LINE TESTING OF THE PROGRAMMABLE INTERCONNECT NETWORK IN FIELD PROGRAMMABLE GATE ARRAYS

This invention was made with Government support under contract number F33615-98-C-1318. The Government has certain rights in this invention.

TECHNICAL FIELD

The present invention relates generally to the field of testing of integrated circuit devices and, more particularly, to a method of testing the programmable interconnect network in field programmable gate arrays.

BACKGROUND OF THE INVENTION

A field programmable gate array (FPGA) is a type of integrated circuit consisting of an array of programmable logic blocks interconnected by a programmable routing network and programmable input/output cells. Programming of the logic blocks, the routing network and the input/output cells is selectively completed to make the necessary interconnections that establish one configuration thereof to provide the desired system operation/function for a particular application.

The present inventors have recently developed methods of built-in self-testing the array of programmable logic blocks and the programmable routing network in FPGAs at the device, board and system levels. These methods are set out in detail in U.S. Pat. Nos. 5,991,907; 6,003,150 and 6,202,182. The full disclosures in these patent applications are incorporated herein by reference.

In each of these prior methods, the reprogrammability of an FPGA is exploited so that the FPGA is configured exclusively with built-in self-test (BIST) logic during off-line testing and subsequently reconfigured to its normal operating configuration. In this way, testability at every level is achieved without overhead. In other words, the BIST logic simply "disappears" when the FPGA is reconfigured for its normal system function.

In addition to these off-line testing methods, the present inventors have also recently developed methods of on-line testing and fault tolerant operation of the programmable logic blocks of FPGAs. These methods are set out in detail in U.S. Pat. 6,256,758 and pending U.S. patent application Ser. No. 09/405,958. The full disclosure of this patent and patent application are also incorporated herein by reference.

On-line testing and fault tolerant operation of FPGAs is most important in high-reliability and high-availability applications, such as, space missions or telecommunication network routers in which adaptive computing systems often rely on reconfigurable hardware to adapt system operation. In such applications, the FPGA hardware must work continuously and simply cannot be taken off-line for testing, maintenance, or repair.

When faults are detected and located in the FPGA hardware of these systems, the FPGA resources must be quickly reconfigured to continue operation in a diminished capacity or to avoid the identified faulty resources altogether. Necessarily, therefore, testing of the FPGA resources must be performed concurrently with normal system operation.

SUMMARY OF THE INVENTION

In accordance with the present invention, the method of testing field programmable gate arrays (FPGAs) is carried out during normal on-line operation of the FPGA by configuring the FPGA resources into a working area and an initial self-testing area. The working area maintains normal operation of the FPGA under test throughout testing. Within the initial and subsequent self-testing areas, however, all the resources of the programmable routing network are tested. Advantageously, the working area is substantially unaffected by the testing, and testing time constraints are reduced since normal operation continues in the working area.

Within the self-testing areas test patterns are generated and propagated along groups of wires under test. The output patterns of a first group of wires under test are preferably compared to the output patterns of a second group of wires under test within the self-testing area receiving the same patterns. This method is similar to the BIST techniques described in detail in the above noted pending patent applications incorporated herein by reference.

In order to achieve a complete test of the programmable routing resources of the FPGA under test, the groups of wires under test include wire segments of varying lengths interconnected by configuration interconnect points. There are two basic types of configuration interconnect points, including cross-points and break-points, and each generally includes a transmission gate controlled by a configuration memory bit.

In addition, the groups of wires under test preferably include programmable logic blocks configured to allow the propagating test patterns to pass there through without alteration. In other words, the programmable logic blocks are configured as identity functions. Advantageously, this allows both global routing resources between programmable logic blocks and local routing resources leading to each programmable logic block to be tested.

As noted above, the output patterns of the groups of wires under test are compared and test result data is generated based on the outcome of the comparison. Passing test result data is generated if the corresponding test patterns match. If a mismatch occurs, a failing test result indication or data is generated. A failing test result or mismatch may be caused by a fault in a wire segment, a configuration interconnect point or a programmable logic block of the groups of wires under test in the self-testing area.

One limitation of this type of comparison-based response analysis is the potential for equivalent faults in the groups of wires under test. Equivalent faults along the groups of wires under test result in erroneous passing test results even though faults exist. In order to overcome this limitation, the preferred method of the present invention further includes the step of comparing the output of the first group of wires under test to the output of the second group of wires under test and the output of a third group of neighboring wires under test. This type of multiple testing substantially eliminates the potential for not detecting equivalent faults.

In order to minimize the number of reconfigurations of the FPGA under test and maintain a short total testing time, parallel testing of the programmable routing resources may be utilized. Specifically, comparisons of the output patterns of the groups of wires under test may be made at several locations along the groups of wires under test. Advantageously, one set of test patterns may be used to test several differing groups of wires per configuration. In addition, the test result data from several compared groups of wires under test may be combined utilizing an iterative comparator. Alternatively, the test result data can be routed directly to an input/output cell of the FPGA under test. Advantageously, this latter approach provides information regarding the location of the fault in the FPGA under test, as opposed to a single pass/fail test result indication for the entire test.

In accordance with an important aspect of the present invention, the self-testing area of the FPGA under test may be divided into vertical and horizontal self-testing areas. Preferably, vertical wire segments are tested utilizing the vertical self-testing area and horizontal wire segments are tested utilizing the horizontal self-testing area. To accommodate on-line testing, programmable logic blocks in both self-testing areas, vertical wire segments in the vertical self-testing area, and horizontal wire segments in the horizontal self-testing area are all designated reserved or unusable during operation of the FPGA under test. In this manner, connections between working area programmable logic blocks may be made utilizing horizontal wire segments through the vertical self-testing area and vertical wire segments through the horizontal self-testing area.

Upon completion of testing of the programmable routing resources located within the initial self-testing area, the FPGA under test is reconfigured so that a portion of the working area becomes a subsequent self-testing area, and the initial self-testing area becomes a portion of the working area. In other words, the self-testing area roves around the FPGA under test repeating the steps of reconfiguring and testing the programmable routing resources in the self-testing areas until each portion of the working area, or the entire FPGA, is reconfigured as a subsequent self-testing area and tested. As noted above, the present method of testing allows for normal operation of the FPGA under test to continue within the working area throughout testing, uninterrupted by the testing conducted within the self-testing areas.

The steps of configuring, testing, and reconfiguring the groups of wires under test and programmable logic blocks within the self-testing areas, storing the subsequent fault status data, and roving the self-testing area around the FPGA under test for further testing are necessarily controlled by a test and reconfiguration controller and an associated storage medium. In operation, the test and reconfiguration controller accesses the FPGA under test during normal system operation and configures the FPGA with one of a plurality of test configurations stored in the associated storage medium. As described above, test patterns generated within the self-testing area provide for exhaustive testing of the groups of wires under test. The test patterns are propagated along the groups of wires under test and the output patterns compared.

BRIEF DESCRIPTION OF THE DRAWINGS

The accompanying drawings incorporated in and forming a part of the specification, illustrate several aspects of the present invention and together with the description serve to explain the principles of the invention. In the drawings.

Reference will now be made in detail to the present preferred embodiment of the invention, an example of which is illustrated in the accompanying drawing.

DETAILED DESCRIPTION OF THE INVENTION

A typical field programmable gate array (FPGA) generally consists of an array of programmable logic blocks interconnected by a programmable routing network and programmable input/output cells or boundary-scan ports (most FPGA's feature a boundary scan mechanism). Such structures are, for example, featured in the Lucent ORCA programmable function units, in the Xilinx XC4000 configurable logic block, and in the ALTERA FLEX 8000 logic element. In accordance with the method of the present invention, the resources of the programmable routing network of the FPGA under test are completely tested during normal operation by configuring the FPGA into a working area and a self-testing area. Advantageously, the working area is substantially unaffected by the testing conducted within the self-testing area.

Figure 1:
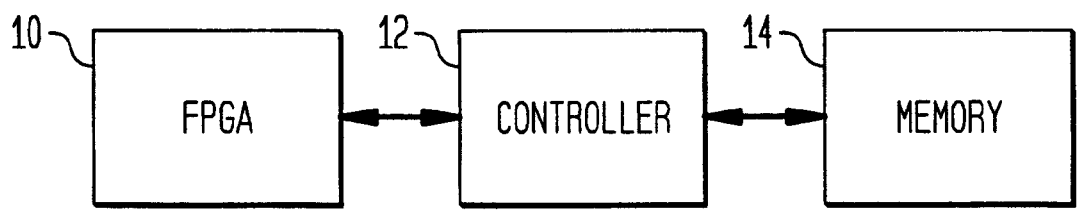
FIG. 1 is a schematic block diagram of an apparatus for testing the programmable interconnect network of a field programmable gate array.

As shown in schematic block diagram in FIG. 1, the steps of configuring, testing, roving, and reconfiguring the resources of an FPGA under test 10 are necessarily controlled by a test and reconfiguration controller 12. In the preferred embodiment, an external test and reconfiguration controller 12 is utilized because present commercially available FPGAs do not allow internal access to their configuration memory. Accordingly, a configuration decompiler tool of a type known in the art is utilized to determine the intended function or mode of operation of the FPGA resources. Alternatively, this information may be extracted from the design stage and made available to the controller 12. It should be appreciated by those skilled in the art that any controller, e.g., internal or external to the FPGA, could be utilized with an FPGA that allows for internal access to its configuration memory and that a single test and reconfiguration controller is capable of controlling several FPGAs. For purposes of illustration of the present preferred embodiment of the invention, however, a one-to-one controller to FPGA ratio is utilized.

The preferred controller 12 may be implemented on an embedded microprocessor in communication with a storage medium or memory 14 for storing the configurations and test data. In operation, the controller 12 accesses the system platform including FPGA under test 10 through its boundary-scan ports in a known manner such that access is transparent to the normal function of the FPGA 10. Advantageously, this approach allows for complete on-line testing during normal operation of the FPGA 10 under test. The controller 12 and memory 14 further exchange and store fault status data for the programmable routing resources.

Figure 2:
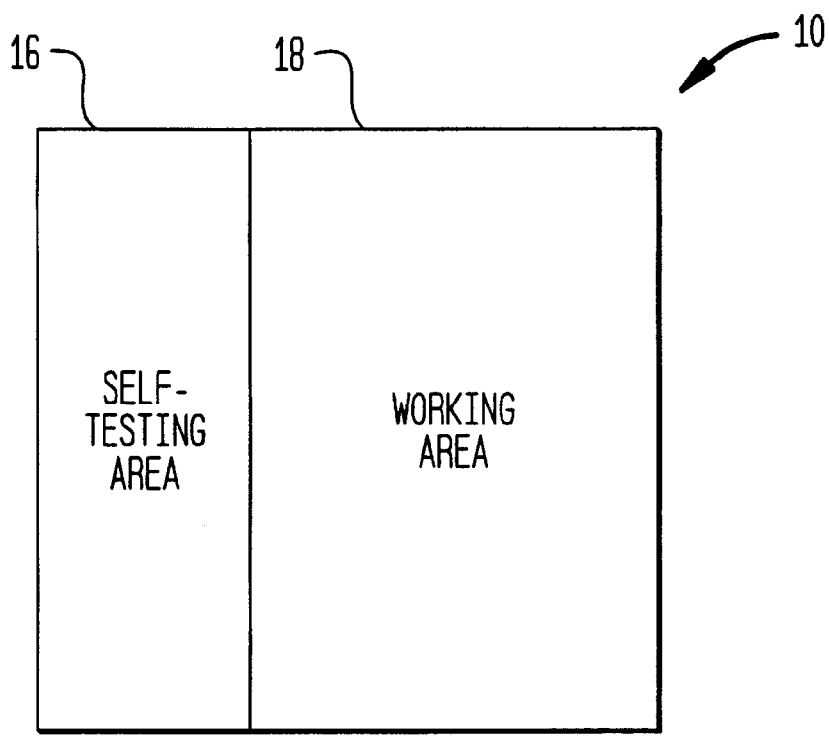
FIG. 2 is an illustration of the FPGA under test configured into an initial self-testing area and a working area wherein the working area maintains normal operation of the FPGA under test.
Figure 3:
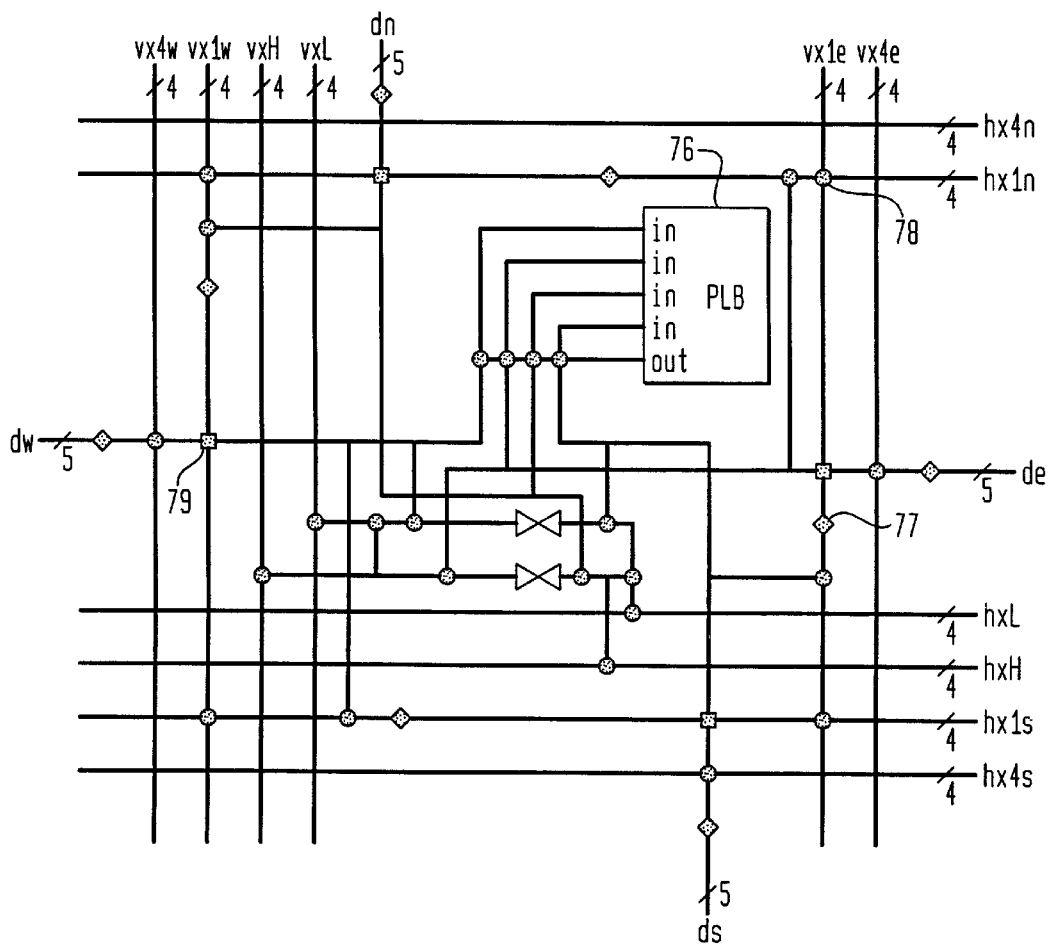
FIG. 3 is a typical wiring schematic illustrating the global and local programmable routing resources associated with a single programmable logic block.

In accordance with the present inventive method, the FPGA under test 10 is initially configured by the controller 12 into an initial self-testing area 16 and a working area 18 as shown in FIG. 2. The working area 18 maintains normal operation of the FPGA under test 10 throughout testing. Within the initial self-testing area 16, the resources of the programmable routing network are exhaustively tested. The programmable routing resources include both global routing resources for carrying signals amongst the array of programmable logic blocks (PLBs), and local routing resources for carrying signals into and out of the PLBs. For example, the typical global and local routing resources associated with a single PLB are shown in FIG. 3 and are discussed in more detail below.

Figure 4:
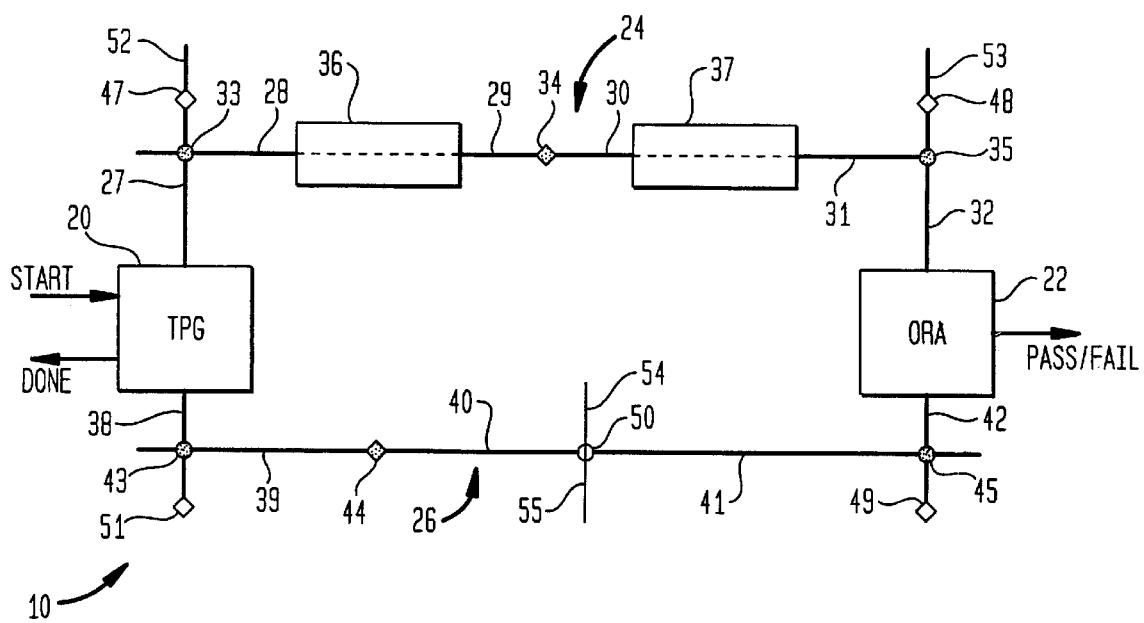
FIG. 4 is a schematic block diagram showing a preferred comparison-based self-testing area configured to include a test pattern generator, an output response analyzer, and two groups of wires under test.

As shown in FIG. 4, a first group of PLBs within the initial self-testing area 16 are configured to include a test pattern generator (TPG) 20 and an output response analyzer (ORA) 22, and a portion of the programmable routing resources are configured to include at least two groups of wires under test (WUTs) 24, 26. The first group of WUTs 24 may include wire segments 27, 28, 29, 30, 31 and 32, configurable or configuration interconnect points (CIPs) 33, 34 and 35, and PLBs 36, 37. Similarly, a second group of WUTs 26 may include wire segments 38, 39, 40, 41 and 42 and CIPs 43, 44 and 45.

During testing, exhaustive test patterns generated using the TPG 20 are propagated along the groups of wires under test 24, 26. The outputs of the groups of WUTs 24, 26 are compared by the ORA 22 to determine whether a fault exists within either group of WUTs 24, 26. A match/mismatch result of the comparison performed by the ORA 22 is communicated as a pass/fail test result or fault status data through the boundary-scan ports of the FPGA (not shown) to the controller 12 for storage in memory 14. The operation of the TPG 20 and ORA 22 in testing the groups of WUTs 24, 26 is similar to the built-in self-test techniques utilized and described in detail in the above-noted pending U.S. patent applications.

The exhaustive set of test patterns generated by the TPG 20 must be suitable to detect all shorts among the WUTs 24, 26 and all stuck-open faults for the closed CIPs (e.g., 33, 34, 35, 43, 44 and 45) along the WUTs. In addition, the open CIPs (e.g., 47, 48, 49, 50 and 51) which isolate the WUTs 24, 26 from the rest of the programmable routing resources must be tested for stuck-closed faults. To accomplish this result, the TPG 20 should also control any wire segment (e.g., 52, 53, 54 and 55) that could become shorted to a wire segment under test 24, 26. For example, when the TPG 22 drives a 0(1) test pattern along the WUTs 24, 26, a contrary test pattern or a 1(0) test pattern should be propagated along wire segments 52, 53, 54 and 55 at least once during the test. A more detailed discussion of the fault model utilized in carrying out the method of the present invention is provided below.

Figure 5A:
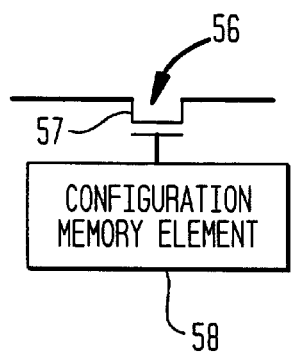
FIG. 5A is a schematical illustration showing a typical configuration interconnect point of a field programmable gate array.
Figure 5B:
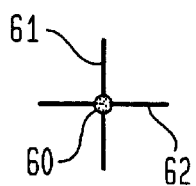
FIG. 5B is a schematical illustration showing a typical cross-point configuration interconnect point of a field programmable gate array.
Figure 5C:
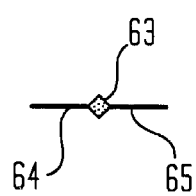
FIG. 5C is a schematical illustration of a typical break-point configuration interconnect point of a field programmable gate array.

In order to fully appreciate the present inventive method, a detailed description of the components utilized in the preferred testing architecture is required. As best shown in FIG. 5A, a typical CIP 56 or switch includes a transmission gate 57 controlled by a configuration memory element or bit 58. There are two basic types of CIPs including cross point CIPs 60 (shown throughout the drawing figures by a circle-shaped symbol) for connecting wire segments located in disjoint planes (see e.g., reference numerals 61 and 62 in FIG. 5B) and break-point CIPs 63 (shown throughout the drawing figures by a diamond-shaped symbol) for connecting wire segments in the same plane (see e.g., reference numerals 64 and 65 in FIG. 5C).

Figure 6:
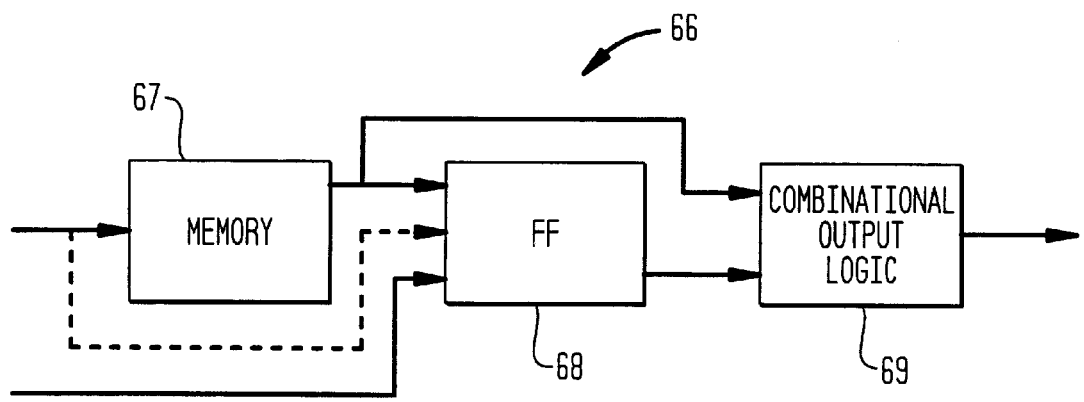
FIG. 6 is a schematical illustration of a typical programmable logic block of a field programmable gate array.

As shown in FIG. 6, a typical PLB 66 includes a memory block 67, a flip-flop block 68 and a combinational output logic block 69. The memory block 67 may be configured to operate as random access memory (RAM) or as a combination look-up table (LUT). In addition, combinational logic within the memory block 67 may be configured to operate as special combinational operators such as a comparator, an adder or a multiplier. Similarly, the flip-flops in the flip-flop block 68 may operate as flip-flops or may be configured to operate as latches. Again, other programming options dealing with synchronous and asynchronous Set and Reset, Clock Enable, etc. could be provided in association with operation as flip-flops or as latches.

The combinational output logic block 69, on the other hand, typically contains a multiplexer in order to connect different wire segments to the output of the PLB 66. Usually this cell has no feed back loops and the flip-flop block 68 can be directly accessed by bypassing the memory block 67 as (shown in dashed lines in FIG. 6). Advantageously, the inputs and outputs of every module or block in this type of simple structure are easy to control and observe, thus facilitating nearly independent testing of the blocks.

As noted above, the preferred testing architecture typically includes a second group of PLBs within the self-testing area 16. In particular and as further shown in FIG. 4, the wire segments of the WUTs 24, 26 are connected to the inputs 28, 30 and outputs 29, 31 respectively of the PLBs 36, 37 of the second group of PLBs. The second group of PLBs are configured as identity functions in order to pass the test patterns from input to output. Advantageously, this allows for testing of the local as well as the global routing resources.

Unlike signature-based compression circuits used in most prior art testing applications, comparison-based ORAs do not suffer from the aliasing problems that occur when some faulty circuits or routing resources produce a good circuit signature. Essentially, as long as the WUTs being compared by the same ORA do not fail in the same way at the same time, no aliasing is encountered with the present comparison-based approach. Of course, such an occurrence is highly unlikely.

Still in accordance with an important aspect of the present invention, potential problems caused by equivalent faults in the WUTs being compared are avoided by comparing the test patterns propagated along the first group of WUTs with the test patterns propagated along two different neighboring groups of WUTs. Specifically, the test patterns propagated along the first group of WUTs is first compared to the test patterns propagated along the second group of WUTs, and subsequently to the test patterns propagated along a third, neighboring group of WUTs. Advantageously, this secondary check substantially eliminates the potential problem of equivalent faults within two groups of WUTs.

Figure 7:
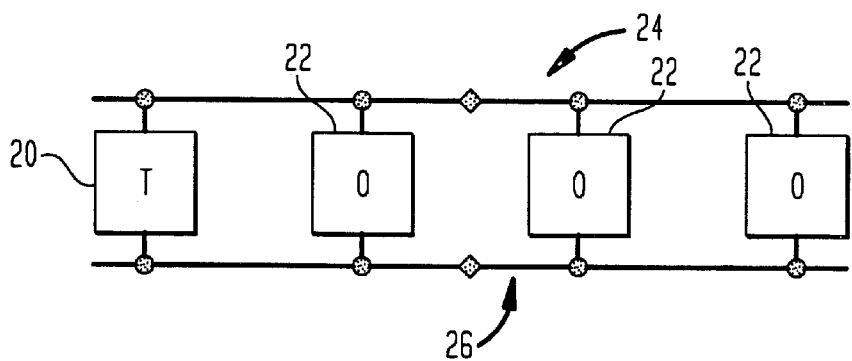
FIG. 7 is a schematic block diagram showing a preferred comparison-based self-testing area configured to include a test pattern generator, two groups of wires under test; and several output response analyzers to accommodate parallel testing.

In order to minimize the number of reconfigurations required during testing, and therefore the total testing time, parallel testing of the programmable routing resources may be utilized. Specifically, as shown in FIG. 7, comparisons of the output patterns of the groups of WUTs 24, 26 may be made at several locations along the groups of WUTs utilizing more than one ORA 22. Advantageously, one set of TPG 20 generated test patterns may be used to test several differing groups of WUTs per configuration.

Figure 8:
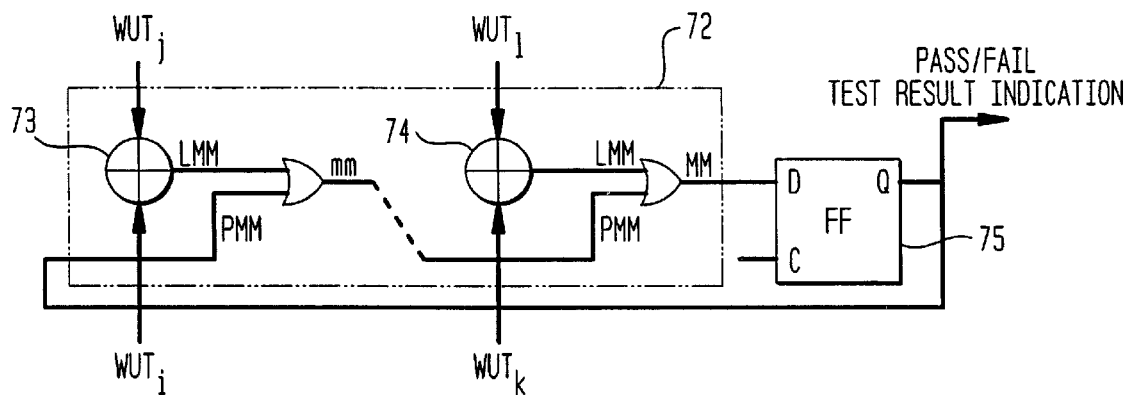
FIG. 8 is a schematical illustration of an iterative comparator with error locking as utilized in the present invention to combine the results of several output response analyzers.

In addition, parallel testing of many groups of WUTs requires a large number of ORAs and boundary-scan ports for receiving the associated test result data or pass/fail indications. In order to combine the test result data of several ORAs, an iterative comparator can be used. In particular, such an iterative comparator 72 may be based upon one proposed by Sridhar and Hayes in "Design of Easily Testable BIT-Sliced Systems", IEEE Trans. on Computers, Vol. C-30, No. 11, pp. 842–54, November, 1981 as shown in the dashed lines in FIG. 8.

Preferably, each ORA 73, 74 compares the corresponding test patterns propagated along the WUTs (e.g., $WUT_i$, $WUT_j$ and $WUT_k$, $WUT_l$ in FIG. 8) to produce test result data or a local mismatch signal (LMM). The iterative comparator 72 ORs the test result indication or previous mismatch signal (PMM) from the first ORA 73 to generate an ORA mismatch signal (MM). The flip-flop 75 is used to record the first mismatch encountered during the test sequence. The feedback from the flip-flop output to the first ORA 73 disables further comparisons after the first error is detected. Except for this feedback signal, all the other ORA signals propagate like in an iterative logic array, using only local routing resources.

Alternately, the various ORA outputs can be routed directly to the boundary-scan ports to retrieve the results as indicated above. This provides more information regarding the location of the fault in the FPGA as opposed to a single pass/fail test indication for the entire test resulting from the use of an iterative comparator.

Figure 9A:
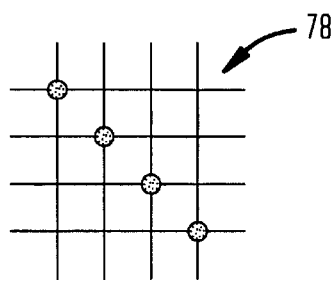
FIG. 9A is a representative wiring schematic illustrating a group of four individual cross-point CIPs at the intersection of a vertical 4-bit bus with an horizontal 4-bit bus.
Figure 9B:
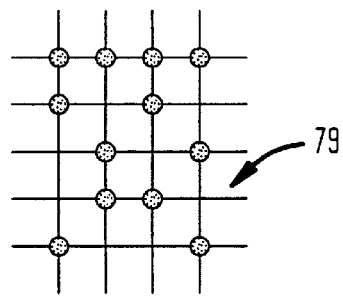
FIG. 9B is a representative wiring schematic illustrating a flexible matrix of cross-point CIPs at the intersection of a 5-bit direct bus with a 4-bit bus.

As indicated above, FIG. 3 illustrates a simplified view of the routing busses associated with a single PLB designated numeral 76 in an ORCA 2C series FPGA. Horizontal and vertical busses are denoted by h and v, respectively. The suffixes x1, x4, xH, and xL indicate wire segments that extend across 1 PLB, 4 PLBs, half the PLB array, and the full length of the PLB array, respectively, before encountering a break-point CIP or a boundary-scan point of the FPGA (not shown). Direct busses provide connections between adjacent PLBs. The four direct busses are designated dn, ds, de, and dw denoting direct north, south, east, and west, respectively. For every PLB there are two sets of vertical x1 busses and two sets of horizontal x1 busses, designated vx1w, vx1e, hx1n, and hx1s. Several CIPs are available to establish different connections among the wire segments as shown by circle and diamond-shaped symbols, The diamond-shaped symbol 77 of a break-point CIP on a 4-bit bus represents a group of 4 individual break-point CIPs. Similarly, and as shown in FIG. 9A, a circle-shaped symbol 78 denoting a cross-point CIP at the intersection of a vertical 4-bit bus with an horizontal 4-bit bus represents a group of 4 individual cross-point CIPs between corresponding wires in the two busses. The square-shaped symbol 79, on the other hand, at the intersection of a 5-bit direct bus with a 4-bit x1 bus represents a more flexible matrix of cross-point CIPs shown in FIG. 9B.

The preferred fault model utilized to test the resources of the programmable interconnect network of a typical FPGA, includes CIPs stuck-closed (stuck-on) and stuck-open (stuck-off), wire segments stuck at 0 or 1, open wire segments, and shorted wire segments. Detecting the CIP faults also detects stuck-at faults in the configuration memory bits that control the CIPs as shown generally in FIG. 5A. For generality, both wired-AND and wired-OR faults are considered as possible behavior for shorted wire segments. A stuck-closed CIP creates a short between its two wires.

Since detailed layout information regarding the adjacency relationships between wire segments is typically not available, only rough physical data available in FPGA data books, for example, is utilized to determine bunches of wire segments for testing. A bunch of wire segments are wire segments that may have pair-wise shorts; but not every wire segment is necessarily adjacent to every other wire segment in the bunch. For example, all the vertical wire segments located between two adjacent PLB columns may be treated as a bunch even if not all shorts are physically feasible. Advantageously, this makes the preferred testing method layout-independent and allows the bus rotations, which make the adjacency relations among wire segments of the same bunch change, to be ignored during testing.

In order to detect the routing faults mentioned briefly above, the applied test patterns must verify that every wire segment and CIP is able to transmit both a 0 and a 1, and that every pair of wire segments that can be shorted can transmit both a (0,1) and a (1,0). Wire segments which can be shorted include vertical and horizontal segments separated by a cross-point CIP to account for the CIP being stuck-on. Applying walking patterns, i.e., walking a 1 through a field of 0s and a 0 through a field of 1s, to the two groups of WUTs is sufficient to create all required test patterns.

An exhaustive set of test patterns produced by a counter, for example, will contain the set of walking test patterns as a subset. Either set detects all shorts between the WUTs. In the present preferred embodiment, however, a counter is utilized to generate exhaustive n-bit test patterns since the counter requires less PLBs than a generator for both n-bit walking patterns, provided that n is not too large. For a large n, the n WUTs may be divided into groups of k<n wire segments to which exhaustive test patterns are applied one group at a time while the other n-k wire segments are set to constant values. Eventually all required pairs of values are applied. An example illustrating the preferred method of testing is set out in detail in the above-referenced U.S. Pat. No. 6,202,182.

Figure 10:
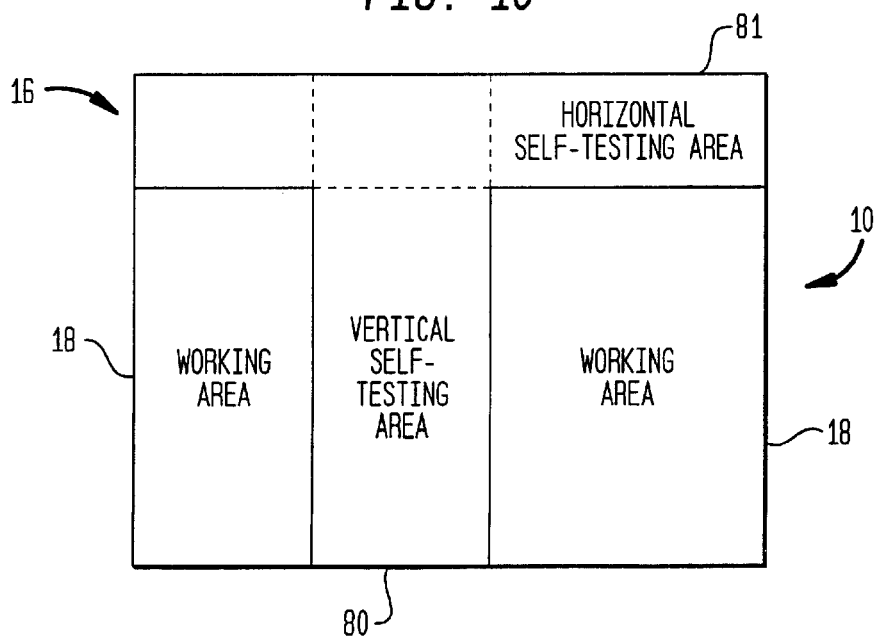
FIG. 10 is an illustration of the preferred FPGA under test with the initial self-testing area subdivided into a vertical self-testing area and an horizontal self-testing area.

In accordance with the present preferred method shown in FIG. 10, the initial self-testing area 16 of the FPGA under test 10 may be divided into a vertical self-testing area 80 and an horizontal self-testing area 81. The vertical self-testing area 80 is primarily utilized to test vertical routing resources or wire segments, and the horizontal self-testing area 81 is primarily utilized to test horizontal routing resources or wire segments. To accommodate operation of the FPGA under test 10 during testing, spare programmable logic blocks in both self-testing areas, horizontal wire segments in the horizontal self-testing area 80, and vertical wire segments in the vertical self-testing area 81 are all designated reserved or unusable. In accordance with an important aspect of the present invention, connections between divided working area PLBs are made utilizing horizontal wire segments through the vertical self-testing area 80 and vertical wire segments through the horizontal self-testing area 81.

Figure 11:
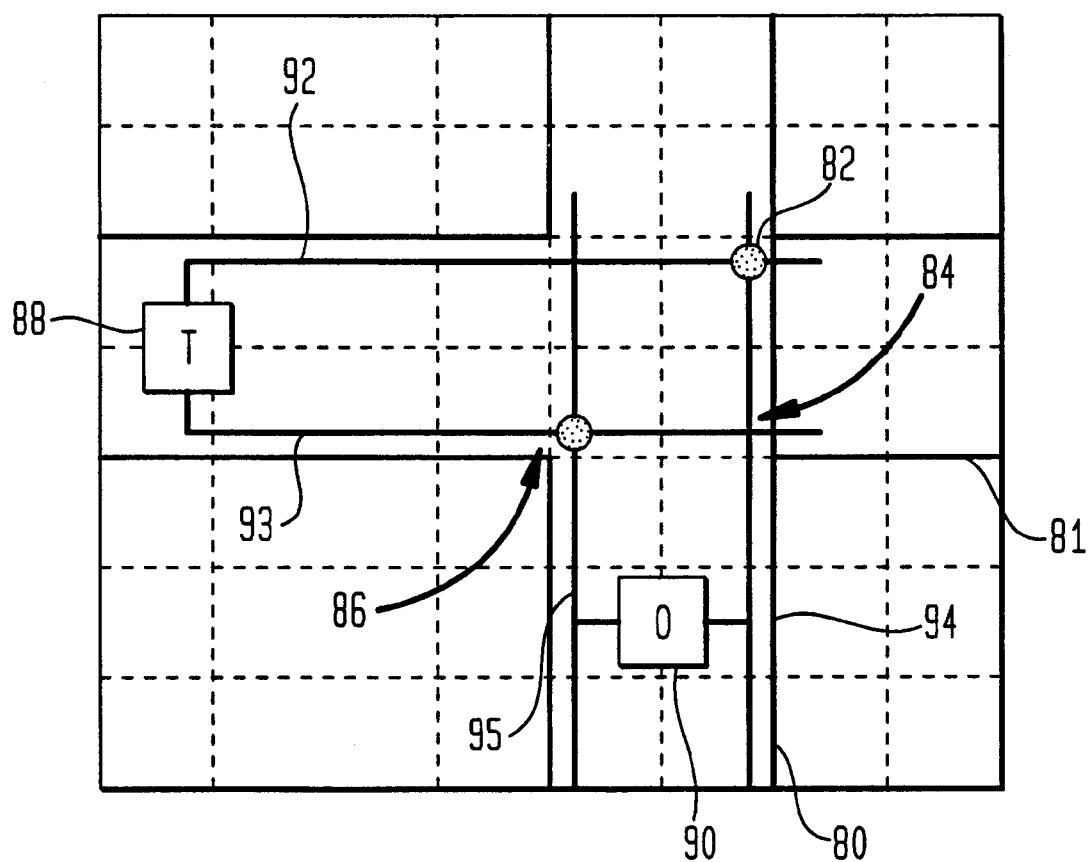
FIG. 11 is a wiring schematic illustrating the preferred method of testing cross-point CIPs utilizing FPGA resources within both a vertical self-testing area and an horizontal self-testing area.

Despite the advantage of continued operation during testing, the utilization of these wire segments to carry system signals through the vertical or horizontal self-testing areas 80 and 81 between divided working area PLBs limits the ability of the self-testing areas to test cross-point CIPs. As shown in FIG. 11, the preferred method of testing cross-point CIPs 82 included in groups of WUTs 84, 86 utilizes both the vertical self-testing area 80 and the horizontal self-testing area 81. Specifically, PLBs within the horizontal self-testing area 81 are configured to include TPG 88 and PLBs within the vertical self-testing area 80 are configured to include ORA 90. The necessary test signals generated by TPG 88 are propagated along horizontal wire segments 92, 93 in the horizontal self-testing area 81, through the cross-point CIPs 82, and along vertical wire segments 94, 95 in the vertical self-testing area 80 for comparison by ORA 90.

Testing each of the cross-point CIPs of the FPGA under test 10 in this manner would require a different test configuration for every possible pair of positions of the vertical and horizontal self-testing areas 80 and 81. In accordance with the present preferred method, therefore, only a subset of the cross-point CIPs are tested on every full horizontal sweep of the self-testing area. More specifically, the horizontal self-testing area 81 is maintained in a fixed position and only the subset of cross-point CIPs in the current intersection of the vertical self-testing area 80 and the horizontal self-testing area 81 are tested. For every full sweep of the vertical self-testing area 80, however, the position of the horizontal self-testing area 81 is different. Advantageously, this preferred method substantially limits the increase in fault latency and overall testing time.

Upon the completion of testing the programmable routing resources located within the initial self-testing area 16, the FPGA under test 10 is reconfigured such that the functions of the PLBs forming a portion of the working area 18 are copied to the PLBs forming the initial self-testing area 16. Once completed, the copied portion of the working area becomes a subsequent self-testing area. Preferably, the initial self-testing area 16 is reconfigured as an adjacent portion of the working area 18, i.e., the programmed function of an adjacent portion of the working area 18 is relocated or more specifically, copied to the initial self-testing area 16, and the adjacent portion of the working area is reconfigured as the subsequent self-testing area.

In accordance with the preferred present inventive method described above, the subsequent self-testing area may similarly be divided into vertical and horizontal self-testing areas 81 and 82 (as shown in FIG. 10) if desired. Further, the step of testing the programmable routing resources within the subsequent testing area is then repeated. This continues until each portion of the working area 18, or the entire FPGA under test 10, is reconfigured as a subsequent self-testing area and its programmable routing resources tested. In other words, the self-testing area roves around the FPGA under test 10 repeating the steps of testing and reconfiguring the programmable routing network until the entire FPGA has undergone testing. Advantageously, normal operation of the FPGA under test 10 continues uninterrupted by the testing conducted within the self-testing areas.

The present preferred method of roving the self-testing area 16 or reconfiguring the FPGA under test 10 is described in detail in the above-mentioned U.S. patent application Ser. No. 09/405,958, incorporated herein by reference.

In summary, the method of testing field programmable gate arrays (FPGAs) is carried out during normal on-line operation of the FPGA by configuring the FPGA resources into a working area and an initial self-testing area. The working area maintains normal operation of the FPGA under test throughout testing. Within the initial and subsequent self-testing areas, however, all the programmable routing resources are exhaustively tested. Advantageously, the working area is substantially unaffected by the testing and testing time constraints are reduced since normal operation continues in the working area.

The foregoing description of a preferred embodiment of the present invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of testing programmable routing resources of a field programmable gate array during normal on-line operation comprising the steps of:

configuring said field programmable gate array into an initial self-testing area and a working area, said working area maintaining normal operation of the field programmable gate array;

testing said programmable routing resources located within said initial self-testing area; and roving said initial self-testing area by reconfiguring said field programmable gate array such that a portion of said working area becomes a subsequent self-testing area and at least a portion of said initial self-testing area becomes a portion of said working area.

2. The method set forth in claim 1, wherein the steps of testing and roving are repeated until each portion of said working area is reconfigured as a subsequent self-testing area and tested.

3. The method set forth in claim 1, wherein the step of configuring said field programmable gate array into an initial self-testing area and a working area further includes configuring a first group of programmable logic blocks within said initial self-testing area to function as a test pattern generator and an output response analyzer, and a portion of said programmable routing resources within said initial self-testing area as at least two groups of wires under test.

4. The method set forth in claim 3, wherein the step of testing said programmable routing resources local within said initial self-testing area includes propagating test patterns generated by said test pattern generator along said at least two groups of wires under test;

comparing outputs of said at least two groups of wires under test using said output response analyzer; and producing fault status data for said at least two groups of wires under test.

5. The method set forth in claim 4, wherein said test patterns are exhaustive and are sufficient to detect all possible faults in said at least two groups of wires under test.

6. The method set forth in claim 4 further comprising the step of repeatedly reconfiguring said programmable routing resources so each portion of said programmable routing resources within said initial self-testing area is configured as said at least two groups of wires under test at least once during testing.

7. The method set forth in claim 3, wherein the step of configuring a portion of said programmable routing resources within said initial self-testing area further includes utilizing a group of wire segments and a group of configuration interconnect points of said programmable routing resources to form said at least two groups of wires under test.

8. The method set forth in claim 7, wherein the step of configuring said field programmable gate array into an initial self-testing area and a working area further includes configuring a second group of programmable logic blocks within said initial self-testing area to pass said test patterns there through, said second group of programmable logic blocks forming a portion of said at least two groups of wires under test, whereby local routing resources of said programmable routing resources are tested.

9. The method set forth in claim 8, wherein the step of testing said programmable routing resources located within said initial self-testing area includes applying a test pattern generated by said test pattern generator to said at least two groups of wires under test;
 comparing outputs of said at least two groups of wires under test using said output response analyzer; and
 producing fault status data for said at least two groups of wires under test.

10. The method set forth in claim 9, wherein said test patterns are exhaustive and are sufficient to detect all possible faults in said at least two groups of wires under test.

11. The method set forth in claim 9 further comprising the step of repeatedly reconfiguring said programmable routing resources within said initial self-testing area so each wire segment and configuration interconnect point becomes one of said at least two groups of wires under test at least once during testing.

12. The method set forth in claim 1 further comprising the step of configuring said initial self-testing area to include an initial horizontal self-testing area primarily for testing horizontal wire segments and an initial vertical self-testing area primarily for testing vertical wire segments.

13. The method set forth in claim 12, wherein the steps of testing and roving are repeated until each portion of said working area is reconfigured as a subsequent self-testing area and tested.

14. The method set forth in claim 12, wherein the step of roving said initial self-testing area includes reconfiguring said field programmable gate array such that a portion of said working area becomes a subsequent horizontal or vertical self-testing area and said initial horizontal or vertical self-testing area becomes a portion of said working area.

15. A method of testing a field programmable gate array including programmable routing resources and programmable logic blocks during normal on-line operation comprising the steps of:
 configuring said field programmable gate array into an initial self-testing area and a working area maintaining normal operation of said field programmable gate array;
 applying test patterns generated by said programmable logic blocks to said programmable routing resources configured as groups of wires under test within said initial self-testing area;
 utilizing said programmable logic blocks to compare outputs of said groups of wires under test within said initial self-testing area; and
 reconfiguring said field programmable gate array such that a portion of said working area becomes a subsequent self-testing area and at least a portion of said initial self-testing area becomes a portion of said working area.

16. The method set forth in claim 15, wherein the steps of applying test patterns, utilizing logic blocks to compare outputs, and reconfiguring are continuously repeated.

17. The method set forth in claim 15 further comprising the step of repeatedly reconfiguring said programmable routing resources so each wire segment and configuration interconnect point within said initial self-testing area is utilized in one of said groups of wires under test at least once during testing.

18. A method of testing a field programmable gate array including programmable routing resources and programmable logic blocks during normal on-line operation comprising the steps of:
 configuring said field programmable gate array into an initial horizontal self-testing area, an initial vertical self-testing area, and a working area maintaining normal operation of said field programmable gate array;
 applying test patterns generated by said programmable logic blocks to a portion of said programmable routing resources configured as groups of wires under test within said initial self-testing areas;
 utilizing said programmable logic blocks to compare outputs of said groups of wires under test within said initial self-testing areas; and
 reconfiguring said field programmable gate array such that a portion of said working area is utilized in forming a subsequent self-testing area and at least a portion of one of said initial self-testing areas becomes a portion of said working area.

19. The method set forth in claim 18, wherein the steps of applying test patterns, utilizing logic blocks to compare outputs, and reconfiguring are repeated until each portion of said working area is reconfigured as a subsequent self-testing area and tested.

20. The method set forth in claim 19, wherein said test patterns are exhaustive and are sufficient to detect all possible faults in said groups of wires under test.

21. The method set forth in claim 20 further comprising the step of repeatedly reconfiguring said programmable routing resources within said initial self-testing areas so each portion of said programmable routing resources within said initial self-testing areas is utilized in one of said groups of wires under test at least once during testing.

22. The method set forth in claim 18, wherein the step of applying test patterns to a portion of said programmable routing resources configured as groups of wires under test further includes utilizing a group of wire segments and a group of configuration interconnect points of said programmable routing resources to form said groups of wires under test.

23. An apparatus for testing programmable routing resources of a field programmable gate array during normal on-line operation comprising:
 a controller in communication with said field programmable gate array for (a) configuring said field programmable gate array into an initial self-testing area and a working area, said working area maintaining normal operation of the field programmable gate array, (b) for testing said programmable routing resources located within said initial self-testing area, and (c) roving said initial self-testing area by reconfiguring said field programmable gate array such that a portion of said working area becomes a subsequent self-testing area and at least a portion of said initial self-testing area becomes a portion of said working area; and a storage medium in communication with said controller for storing a plurality of test configurations and fault status data.

24. A field programmable gate array comprising:

a plurality of programmable logic blocks;

a plurality of programmable routing resources interconnecting said programmable logic blocks;

a plurality of input/output cells;

said programmable logic blocks and said programmable routing resources being initially configured as an initial self-testing area for testing a portion of the programmable routing resources within said initial self-testing area, and an initial working area for maintaining normal on-line operation of the field programmable gate array during testing; and said programmable logic blocks and said programmable routing resources being subsequently configured as a subsequent self-testing area for testing a different portion of the programmable routing resources within said subsequent self-testing area, and a subsequent working area for maintaining normal on-line operation of the field programmable gate array during subsequent testing.

25. The field programmable gate array of claim 24, wherein a portion of said programmable logic blocks within said initial self-testing area are configured to function as a test pattern generator and an output response analyzer, and a portion of said programmable routing resources within said initial self-testing area are configured as at least two groups of wires under test.

26. The field programmable gate array of claim 25, wherein said test pattern generator generates an exhaustive set of test patterns for testing said at least two groups of wires under test; and said output response analyzer compares outputs of said at least two groups of wires under test and produces fault status data for said at least two groups of wires under test.

* * * * *